United States Patent [19]

Ponder

[11] 4,334,293
[45] Jun. 8, 1982

[54] SEMICONDUCTOR MEMORY CELL WITH CLOCKED VOLTAGE SUPPLY FROM DATA LINES

[75] Inventor: James E. Ponder, Cat Spring, Tex.

[73] Assignee: Texas Instruments Incorporated, Dallas, Tex.

[21] Appl. No.: 148,614

[22] Filed: May 12, 1980

Related U.S. Application Data

[63] Continuation of Ser. No. 925,893, Jul. 19, 1978, Pat. No. 4,209,851.

[51] Int. Cl.³ .......................... G11C 7/00; G11C 11/40
[52] U.S. Cl. ...................................... 365/190; 365/154; 365/222
[58] Field of Search ............... 365/154, 190, 205, 222; 307/279, 291

[56] References Cited

U.S. PATENT DOCUMENTS 3,550,097 12/1970 Reed .................................... 365/190
4,103,185 7/1978 Denes .................................. 307/279

FOREIGN PATENT DOCUMENTS 1011457 5/1977 Canada ................................ 307/279

OTHER PUBLICATIONS

Miller, COS/MOS Random Access Memories, IEEE Digest, pp. 34-35, 3/71.

Primary Examiner—Stuart N. Hecker
Attorney, Agent, or Firm—John G. Graham

[57] ABSTRACT

An MOS memory cell of the static type employs a pair of cross-coupled driver transistors forming a bistable circuit, with load resistors replaced by a pair of series coupling transistors connecting storage nodes to complementary precharged data lines. The coupling transistors are turned on in sequence, for refresh, so an intermediate node is charged during a first phase and discharged into the storage nodes during the second phase. Both transistors are turned on at the same time for read or write operations.

8 Claims, 2 Drawing Figures

SEMICONDUCTOR MEMORY CELL WITH CLOCKED VOLTAGE SUPPLY FROM DATA LINES

This is a continuation of application Ser. No. 925,893, filed July 19, 1978, now U.S. Pat. No. 4,209,851.

RELATED CASES

The subject matter of this application is related to that Ser. No. 925,891 (now U.S. Pat. No. 4,236,229), Ser. No. 925,892 (now U.S. Pat. No. 4,198,695), and Ser. No. 925,916 (now U.S. Pat. No. 4,184,208).

BACKGROUND OF THE INVENTION

This invention relates to semiconductor memory devices, and more particularly to an improved static type random access, read/write memory.

For use as memory in small minicomputers and microprocessor systems, static semiconductor memory has an advantage compared to dynamic memory in that static does not require refresh. Dynamic MOS RAMs employ one-transistor cells compared to six transistor cells in conventional static RAMs, so the dynamic devices are much lower in cost because higher densities are achieved on smaller bar sizes. Unfortunately, the storage capacitors in dynamic cells leak charge and the data must be periodically refreshed by addressing each row of a memory array. In large memory systems, the circuitry required for refresh is small in proportion, but in the small memory associated with microcomputers, particularly on-chip registers the refresh control circuitry is a significant portion of the system cost, so static type RAM cells must be used. Previous attempts to reduce the cell size in pseudo static or self refresh cells to make them more suitable for microcomputer devices include the following patents or applications, all assigned to Texas Instruments:

U.S. Pat. No. 3,955,181 issued to Joseph H. Raymond, Jr.

U.S. Pat. No. 4,110,776 issued to Rao et. al.

U.S. Pat. No. 4,142,111 issued to David J. McElroy

It is a principal object of this invention to provide improved memory devices made in a semiconductor integrated circuits. Another object is to provide an improved "static" or self refresh type MOS memory device, particularly a memory device of small cell size. An additional object is to provide small area pseudo static or self refresh memory elements in semiconductor integrated circuits which may be incorporated into microcomputer devices.

SUMMARY OF THE INVENTION

In accordance with an embodiment of this invention, an MOS memory cell of the static type employs a pair of cross-coupled driver transistors forming a bistable circuit, with load resistors replaced by a pair of series coupling transistors connecting storage nodes to complementary precharged data lines. The coupling transistors are turned on in sequence, for refresh, so an intermediate node is charged during a first phase and discharged into the storage nodes during the second phase. Both transistors are turned on at the same time for read or write operations.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

DETAILED DESCRIPTION OF SPECIFIC EMBODIMENT

Figure 1:
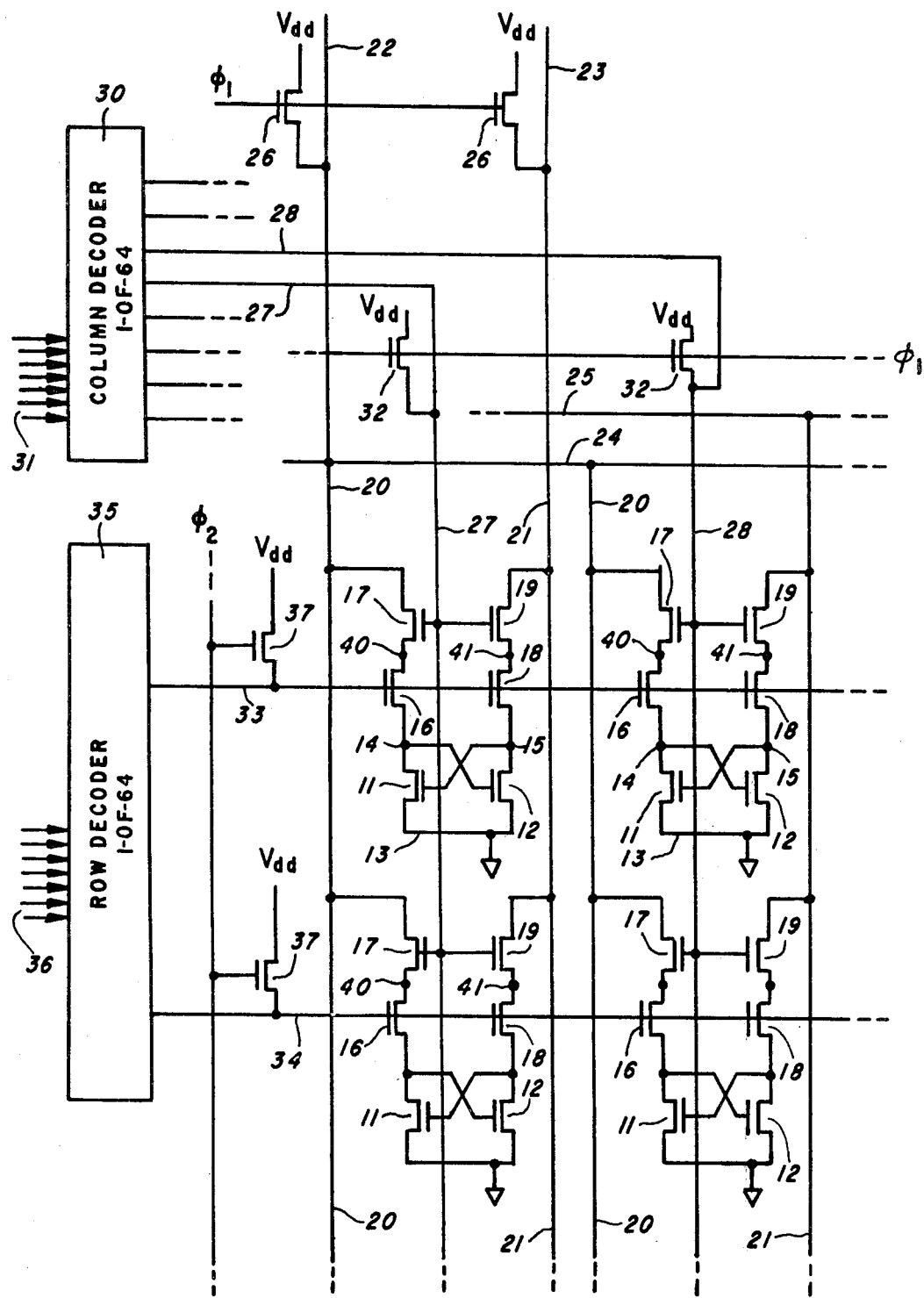
FIG. 1 is an electrical schematic diagram of an array of memory cells according to the invention.

Referring to FIG. 1, there is shown a part of an array of memory cells 10 constructed according to the invention. Each cell 10 includes a pair of driver transistors 11 and 12 which have a common source region 13 connected to ground or Vss. The drain 14 or 15 of each of the driver transistors is connected to the gates of the opposite transistor, providing a cross coupled bistable circuit. No load resistors of the conventional type are used. A pair of series transistors 16 and 17 connect the drain 14 of the driver transistor 11 to a data line and likewise a pair of series transistors 18 and 19 connect the drain 15 of the driver transistor 12 to the data bar line in each cell 10 in each column. The data and data bar lines 20 and 21 are connected to common data and data bar input/output lines 22 and 23. It is important that the lines 20 and 21 need not be selected by the Y decoder; instead, all of the data lines 20 are connected together by a line 24 to the I/O line 22, while all of the data bar lines 21 are connected together by a line 25 to the I/O line 23. In a typical memory device, the columns would be partitioned into eight groups of eight, for example, so there would be eight sets of the lines 22 and 23. In this description, however, partitioning is not shown. The I/O lines 22 and 23 are connected to the supply voltage Vdd by transistors 26 which are clocked by $\Phi 1$, shown in FIG. 2a, during a refresh cycle. Thus the lines 22 and 23 along with all of the lines 20 and 21 for all of the columns are precharged to Vdd during $\Phi 1$.

The gates of all of the transistors 17 and 19 in each column are connected by a Y select line 27 or 28 to a column decoder 30. A Y address is applied to the column decoder 30 by inputs 31, causing the decoder to select one of the lines 27, 28, etc. and hold it at logic "1" level or near Vdd, while all the other lines 27, 28, etc. are held at Vss. It is noted that the decoder 30 is a simple one-of-sixty-four selector (for a 64×64 array with no partitioning). The column select lines 27, 28, etc. are all held at logic "1" during the precharge part of a refresh cycle due to transistors 32 connecting all of these lines to Vdd. The gates of the transistor 32 are all connected to the $\Phi 1$ clock.

The gates of all of the transistors 16 and 18 in each row are connected by a row select line 33 or 34 to a row decoder 35 which selects one of the sixty-four lines 33, 39, etc. for a read or write operation, based on an X address on inputs 36. For refresh operations, all of the lines 33, 34, etc. are connected to Vdd by transistors 37 during the $\Phi 2$ clock seen in FIG. 26.

Figure 2:
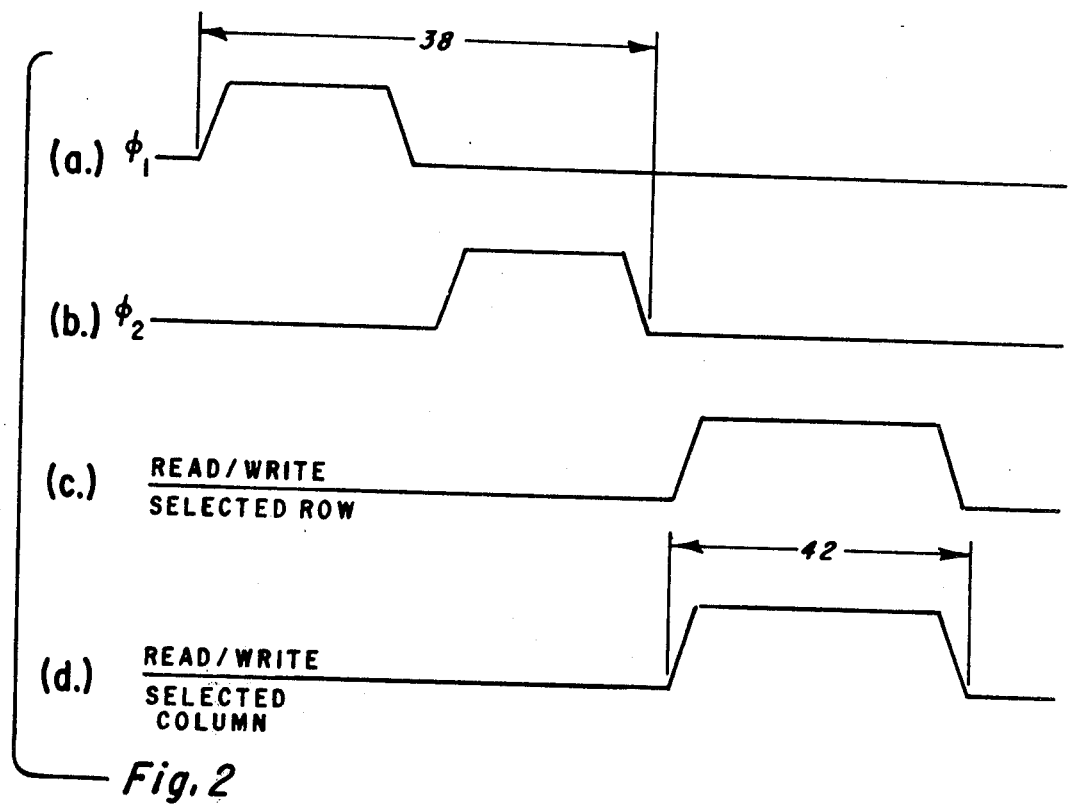
FIGS. 2a-2d are graphic representations of voltage vs. time for the voltage appearing at various points in the cell array of FIG. 1.

During a refresh cycle which occupies a time period 38 in FIG. 2a and 2b, all of the D and $\overline{D}$ lines 20 and 21 are first precharged to about (Vdd−Vt) during $\Phi 1$ via transistors 26. At the same time, all of the transistors 17 and 19 in all columns are turned on via transistors 32 through which the lines 27, 28, etc. are charged to about (Vdd−Vt). This causes the nodes 40 and 41 in each cell 10 to charge to about (Vdd−2Vt). These nodes ordinarily would be N+ diffused regions in N-channel devices, and exhibit some capacitance although not a great deal. This capacitance holds a small amount of charge after Φ1 goes off and the transistors 17 and 19 turn off. Then, when Φ2 goes high and the transistors 16 and 18 turn on, this charge is supplied to the drains 14 and 15 and the gates of the cross-coupled driver transistors 11 and 12; one side will dissipate the charge to Vss through the transistor 11 or 12 which is conducting, while the other side which is non-conducting will cause the charge to be stored on the gate of the conducting transistor 11 or 12 after Φ2 goes low.

A read or write operation occurs during a time period 42, i.e., at a time other than during refresh. One row selected by the row decoder 35 will have a logic "1" voltage applied to its row line 33, 34, etc., all of the others will be at Vss; this voltage is shown in FIG. 2c. At the same time, one column will have a logic "1" voltage applied to its column select line 27, 28, etc. from the column decoder 30, all other column select lines being held at Vss. The voltage on the selected column line 27 or 28 is shown in FIG. 2d. If a read operation is performed, for one cell in the entire array the voltage on the drains 14 and 15 will be coupled to the input/output lines 22 and 23; one line will be a "1" and the other a "0" depending upon whether a binary one or zero has been stored. This voltage is sensed by a differential sense amplifier and a single output is produced. If a write operation is performed, the one selected cell will have the storage nodes 14 and 15 connected to the input/output lines 22 and 23, so whatever voltage is applied to these lines will be forced into the storage nodes and held after the time period 42 ends.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore comtemplated that the appended claims will cover any such modifications of embodiments as fall within the true scope of the invention.

What is claimed is:

1. An array of rows and columns of identical static self-refresh memory cells, each cell comprising a pair of cross-coupled driver transistors and first and second pairs of coupling transistors, each of the transistors being an insulated-gate field-effect transistor of the same channel conductivity type having a source-to-drain path and a gate, each cell having a pair of storage nodes with no d.c. path from the storage nodes to a voltage supply, a plurality of pairs of complementary data lines providing the column lines for the array of cells, each of the first pair of coupling transistors having their source-to-drain paths connected between one of the data lines of a pair and one of the storage nodes of a cell, means including the second pair of coupling transistors for refreshing the pair of storage nodes during a first time period, a plurality of first conductive means providing array address lines for applying operating voltage to the gate electrodes of the second pair of transistors in each of the cells during said first time period, and second conductive means providing a row address line for applying operating voltage to the gate electrodes of the first pair of transistors in each of the cells during a second time period for a selected row in each operating cycle, the first conductive means not applying operating voltage to the control electrodes of said first pair of transistors during said second time period during a refresh cycle.

2. A memory cell array according to claim 1 wherein the first pair of coupling transistors in each cell has source-drain paths adjacent the data line and the second pair of coupling transistors has source-drain paths adjacent the storage node.

3. A memory cell array according to claim 2 wherein the first conductive means applies an operating voltage to the control electrodes of said first of the coupling transistors during a later time period for read or write operations.

4. A memory cell array according to claim 2 wherein a node between the current paths of the coupling transistors in each pair is charged during the first time period.

5. A memory cell array according to claim 1 wherein the drain of each of the driver transistors is connected to the gate of the other to provide a cross coupled bistable circuit.

6. A memory cell array according to claim 5 wherein the first conductive means provides a column address line for a plurality of cells in a column.

7. A memory cell array according to claim 6 wherein a plurality of pairs of said data lines further provide the column lines for the array of cells.

8. A memory cell array according to claim 7 wherein means are provided for selecting one row and one column for read or write operations, and all cells are refreshed prior to a read or write operation.

* * * * *